(12) United States Patent
Hassan et al.

(10) Patent No.: US 8,972,820 B2
(45) Date of Patent: Mar. 3, 2015

(54) WIRELESS ACCESS POINT MAPPING

(71) Applicant: Microsoft Corporation, Redmond, WA (US)

(72) Inventors: Amer A. Hassan, Kirkland, WA (US); Mitesh K. Desai, Sammamish, WA (US); Billy R. Anders, Jr., Bothell, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 90 days.

(21) Appl. No.: 13/684,146

(22) Filed: Nov. 21, 2012

(65) Prior Publication Data
US 2014/0143629 A1    May 22, 2014

(51) Int. Cl.
*H03M 13/00* (2006.01)
*H04W 24/00* (2009.01)
*H03M 13/09* (2006.01)
*H04W 24/04* (2009.01)

(52) U.S. Cl.
CPC .............. *H04W 24/00* (2013.01); *H03M 13/09* (2013.01); *H04W 24/04* (2013.01)
USPC ............................. 714/758; 714/790; 714/796

(58) Field of Classification Search
CPC ............................. H03M 13/09; H04L 1/0061
USPC .......................... 714/758, 790, 725, 796, 704
See application file for complete search history.

(56) References Cited

U.S. PATENT DOCUMENTS

| 7,899,006 | B2 | 3/2011 | Boyd | |
| 8,060,017 | B2 | 11/2011 | Schlicht et al. | |
| 8,494,094 | B2* | 7/2013 | Raman et al. | 375/343 |
| 8,514,950 | B2* | 8/2013 | Aoki et al. | 375/242 |
| 8,560,928 | B2* | 10/2013 | Kim et al. | 714/790 |
| 2006/0220851 | A1 | 10/2006 | Wisherd | |
| 2006/0258295 | A1 | 11/2006 | Wong et al. | |
| 2008/0242310 | A1 | 10/2008 | Vassilovski | |
| 2009/0219888 | A1 | 9/2009 | Chen et al. | |
| 2011/0207411 | A1 | 8/2011 | Phillips | |
| 2011/0217964 | A1 | 9/2011 | Matsuo et al. | |
| 2011/0287762 | A1 | 11/2011 | Kumar et al. | |
| 2012/0133555 | A1 | 5/2012 | Hyun | |

OTHER PUBLICATIONS

Carneiro, Nick, "Real Time Indoor Navigation for Android Phones", Retrieved at <<http://trillworks.com/nick/2011/11/25/real-time-indoor-navigation-for-android-phones/>>, Nov. 25, 2011, pp. 5.

(Continued)

*Primary Examiner* — Fritz Alphonse
(74) *Attorney, Agent, or Firm* — Kate Drakos; Micky Minhas

(57) ABSTRACT

Techniques for wireless access point mapping are described. In at least some embodiments, various characteristics of a wireless access point are detected. Examples of such characteristics include signal strength for wireless signal transmitted by the wireless access point, identifying information for the wireless access point, data error rates for data transmitted by the wireless access point, and so forth. Characteristics of a wireless access point can be detected at multiple different geographic locations to enable a reception range mapping to be generated for the wireless access point, e.g., for an area in which signal reception for the wireless access point is qualitatively acceptable.

20 Claims, 9 Drawing Sheets

(56) References Cited

OTHER PUBLICATIONS

Kitasuka, et al., "WiPS Location and Motion Sensing Technique of IEEE 802.11 Devices", Retrieved at<<http://ieeexplore.ieee.org/stamp/stamp.jsp?tp=&arnumber=1488983>>, Third International Conference on Information Technology and Applications, 2005. ICITA 2005, Jul. 4, 2005, pp. 4.

"International Search Report & Written Opinion for PCT Patent Application No. PCT/US2013/070857", Mailed Date: Mar. 6, 2014, Filed Date: Nov. 19, 2013, 11 Pages.

* cited by examiner

US 8,972,820 B2

WIRELESS ACCESS POINT MAPPING

BACKGROUND

Many devices today utilize some form of wireless data communication. While a variety of different types of wireless data communication exist, radio frequency (RF) communication is pervasive. Examples of RF communication include cellular networks (e.g., for cell phones), Wi-Fi®, broadcast television, global positioning system (GPS) navigation, and so forth.

Wireless data communication can be particularly useful in networking scenarios. For instance, a computing device can connect to a network, such as the Internet, via a wireless access point. Locating a wireless access point, however, can present a number of challenges.

For instance, in an enterprise environment, locating an unauthorized wireless access point at an enterprise facility can be important to protect information security. This is particularly true with the increased proliferation of Soft AP (access point) devices that can beacon wireless signals at a typical RF radiation power.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Techniques for wireless access point mapping are described. In at least some embodiments, various characteristics of a wireless access point are detected. Examples of such characteristics include signal strength for wireless signal transmitted by the wireless access point, identifying information for the wireless access point, data error rates for data transmitted by the wireless access point, and so forth. Characteristics of a wireless access point can be detected at multiple different geographic locations to enable a reception range mapping to be generated for the wireless access point, e.g., for an area in which signal reception for the wireless access point is qualitatively acceptable.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Overview

Figure 1:
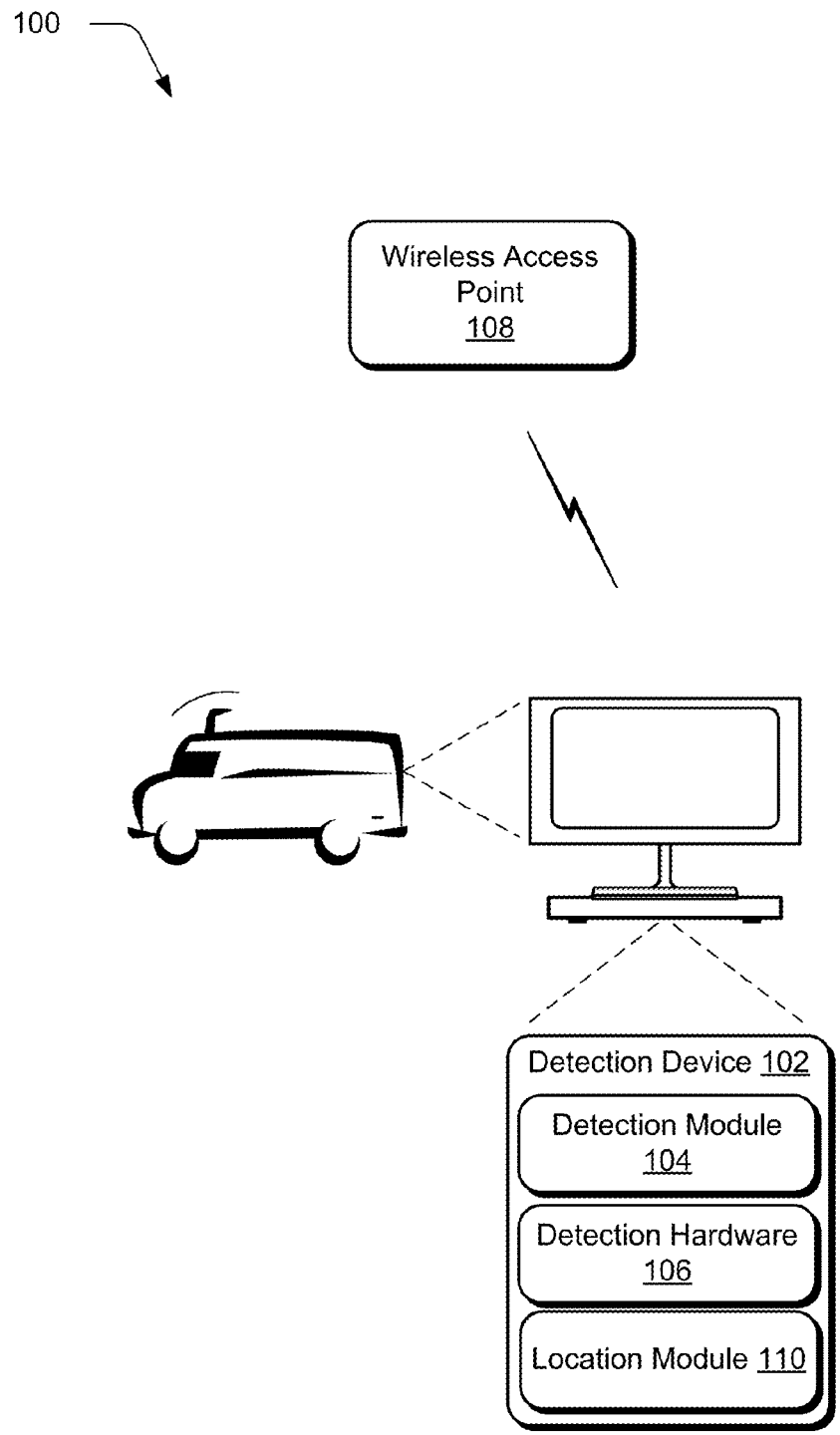
FIG. 1 is an illustration of an environment in an example implementation that is operable to employ techniques discussed herein in accordance with one or more embodiments.

Techniques for wireless access point mapping are described. In at least some embodiments, various characteristics of a wireless access point are detected. Examples of such characteristics include signal strength for wireless signal transmitted by the wireless access point, identifying information for the wireless access point, data error rates for data transmitted by the wireless access point, and so forth. Characteristics of a wireless access point can be detected at multiple different geographic locations to enable a reception range mapping to be generated for the wireless access point, e.g., for an area in which signal reception for the wireless access point is qualitatively acceptable.

Availability of direct connection wireless devices (e.g., Wi-Fi Direct™ devices) is on the increase. These devices typically assume a particular role in wireless environment, such as a client role (sometimes called mobile station), or a Group Owner (GO) role. For instance, a Group Owner can be implemented as a software implementation of an access point. Having unauthorized GO devices in an enterprise environment can cause management problems if information technology (IT) personnel are not able to locate and control them. Thus, IT control of a GO device is important to information security in an enterprise environment. A similar situation applies for rogue access points, including those integrated in wireless wide area network (WWAN) devices and used on an enterprise network. Therefore, locating access points at and/or near an enterprise facility (e.g., on a corporate campus) is important. Accordingly, techniques for wireless access point mapping discussed herein can be employed to locate wireless access points in an enterprise environment to determine if the wireless access points are authorized, and/or to enable IT personnel to manage and/or monitor network activities associated with wireless access points.

In at least some implementations, wireless signal detected at a particular location from a wireless access point can have high signal strength, e.g., a high received signal strength indicator (RSSI). The wireless signal, however, may include multiple data errors, such as flipped bits, omitted bits, inserted bits, and so on. Thus, a quality indicator for the wireless signal at the particular location can be adjusted based on the presence of the multiple data errors.

For instance, an indication of signal strength at the location can be adjusted downward to indicate that while the signal strength may be high, the number of data errors is also high. A reception range mapping for the wireless access point can reflect the adjusted signal quality, such as by omitting the location from the reception range mapping, or indicating that the location is at a periphery of an effective signal reception range for the wireless access point.

According to at least some embodiments, multiple characteristic values for a wireless access point can be detected at a particular location, and can be averaged to obtain an average characteristic value. Examples of such characteristic values include signal strength values, data error rate values, distance reading values (e.g., distance from a detecting device to the wireless access point), and so forth. Averaged characteristic values can be used in determining a signal quality for the wireless access point, and/or for mapping a signal reception range for the wireless access point.

In at least some implementations, data that is used to characterize a wireless signal includes control data and/or user data. Generally, control data includes data that describes various administrative information for data transmission to and/or from a wireless access point. Examples of control data include a source address (e.g., an address for a wireless access point), a destination address for a particular data stream, types of error detection coding utilized by a wireless access point, data sequencing information, and so forth. User data includes a data "payload" of a wireless signal, such as content (e.g., web pages, video and/or audio content, and so on), communication between users (e.g., messaging, email, and so forth), documents, and so on.

In implementations where user data is utilized to characterize a wireless signal, steps are taken to protect the privacy of information included in the user data. For instance, when user data is utilized to detect characteristics of a wireless signal (e.g., signal strength, data error rate, and so forth), the user data is discarded afterward. In implementations where user data in a wireless signal is encrypted, characteristics of the wireless signal can be detected without decrypting the encrypted user data. Thus, characteristics of a wireless signal can be detected without reading and/or decrypting user data included in the wireless signal.

In at least some implementations, wireless data communication discussed herein can be implemented via a wireless local area network (WLAN) associated with a wireless access point. The WLAN, for example, can be implemented by the wireless access point according to the 802.11 Standards for wireless data communication managed by the Institute of Electrical and Electronics Engineers (IEEE). Typically, the WLAN standards specify particular channel frequency bands which wireless devices may utilize to communicate. Examples of these frequency bands include 2.4 gigahertz (GHz), 3.6 GHz, 5 GHz, and so on. However, a wide variety of different wireless communication types and standards may be employed in accordance with the embodiments claimed herein.

In the following discussion, an example environment is first described that is operable to employ techniques described herein. Next, a section entitled "Example Methods and Implementation Scenarios" describes some implementation scenarios involving techniques discussed herein which may be employed in the example environment as well as in other environments. Following this, a section entitled "Distance Mapping for Wireless Access Points" describes some example embodiments for determining distance measurements for wireless access points. Next, a section entitled "Value Averaging" describes some example embodiments for averaging various characteristics values of wireless access points. Finally, a section entitled "Example System and Device" describes an example system and device that are operable to employ techniques discussed herein in accordance with one or more embodiments.

Example Environment

FIG. 1 is an illustration of an environment 100 in an example implementation that is operable to employ techniques for wireless access point mapping discussed herein. Environment 100 includes a detection device 102 which can be embodied as any suitable computing device such as, by way of example and not limitation, a desktop computer, a portable computer (e.g., a laptop), a handheld computer such as a personal digital assistant (PDA), a tablet computer, and so forth. One of a variety of different examples of the detection device 102 is shown and described below in FIG. 12.

The detection device 102 includes and/or makes use of a detection module 104, which is representative of functionality to process and determine various attributes of wireless signals that are received at the detection device 102. The detection module 104 can be configured to transmit and receive data communication via a variety of different wireless techniques and protocols. Examples of such techniques and/or protocols include cellular communications (e.g. 2 G, 3 G, 4 G, and so forth), near field communication (NFC), short-range wireless connections (e.g., Bluetooth), local area wireless networks (e.g., one or more standards in compliance with IEEE 802.11), wide area wireless networks (e.g., one or more standard in compliance with IEEE 802.16), wireless telephone networks, and so on. For instance, the detection module 104 is configured to employ techniques for wireless access point mapping discussed herein.

The detection device 102 further includes detection hardware 106, which is representative of various hardware components that can be employed to enable the detection device 102 to transmit and/or receive data communication wirelessly. Examples of the detection hardware 106 include a radio transmitter, a radio receiver, various types and/or combinations of antennas, impedance matching functionality, and so on.

The environment 100 further includes a wireless access point 108, which is representative of a variety of different types and/or implementations of functionalities for transmitting and/or receiving wireless data communication. For instance, the wireless access point 108 can function as a bridge for wireless access to various networks, such as a WLAN, the Internet, a Wide Area Network (WAN), and so on. In at least some embodiments, the wireless access point 108 can pass wireless data between various entities, such as utilizing one or more routers, modems, and so forth. Alternatively or additionally, the wireless access point 108 can be implemented utilizing an end-user device that can transmit and receive wireless signals, such as via an ad-hoc wireless network.

In at least some implementations, the detection device 102 and its various components can be employed in a mobile scenario to detect various attributes of different wireless access points, including the wireless access point 108. For instance, the detection device 102 can be placed in a vehicle such that while the vehicle is in motion, the detection device 102 can detect various attributes of different wireless access points that are encountered at different locations. Alternatively, functionalities of the detection device 102 (e.g., the detection module 104) can reside at a remote location, and can receive information about different wireless access points remotely.

Further to one or more implementations, the detection device 102 includes a location module 110, which is representative of functionality to determine various locations associated with the detection device 102, the wireless access point 108, and so on. For instance, the location module 110 can leverage different types of location information to determine a location of the detection device 102. Examples of location information include global positioning system (GPS) coordinates, location information from nearby mobile phone base stations, and so forth. As discussed below, the location module 110 may utilize geographic information as well as various processing of wireless signals to determine wireless service ranges and/or distances for wireless access points, such as the wireless access point 108.

Although not expressly illustrated in FIG. 1, the environment 100 may include a network via which the detection device 102 and the wireless access point 108 may communicate. Examples of such a network include a local area network (LAN), a wide area network (WAN), the Internet, and so on. Thus, the detection device 102 and the wireless access point 108 may communicate with each other directly, and/or via one or more intermediary networks.

Having described an example environment in which the techniques described herein may operate, consider now a discussion of some example methods and implementation scenarios in accordance with one or more embodiments.

Example Methods and Implementations

The following discussion describes example methods and implementations in accordance with one or more embodiments. The methods and implementations may be implemented in the environment 100 of FIG. 1, and/or any other suitable environment.

Figure 2:
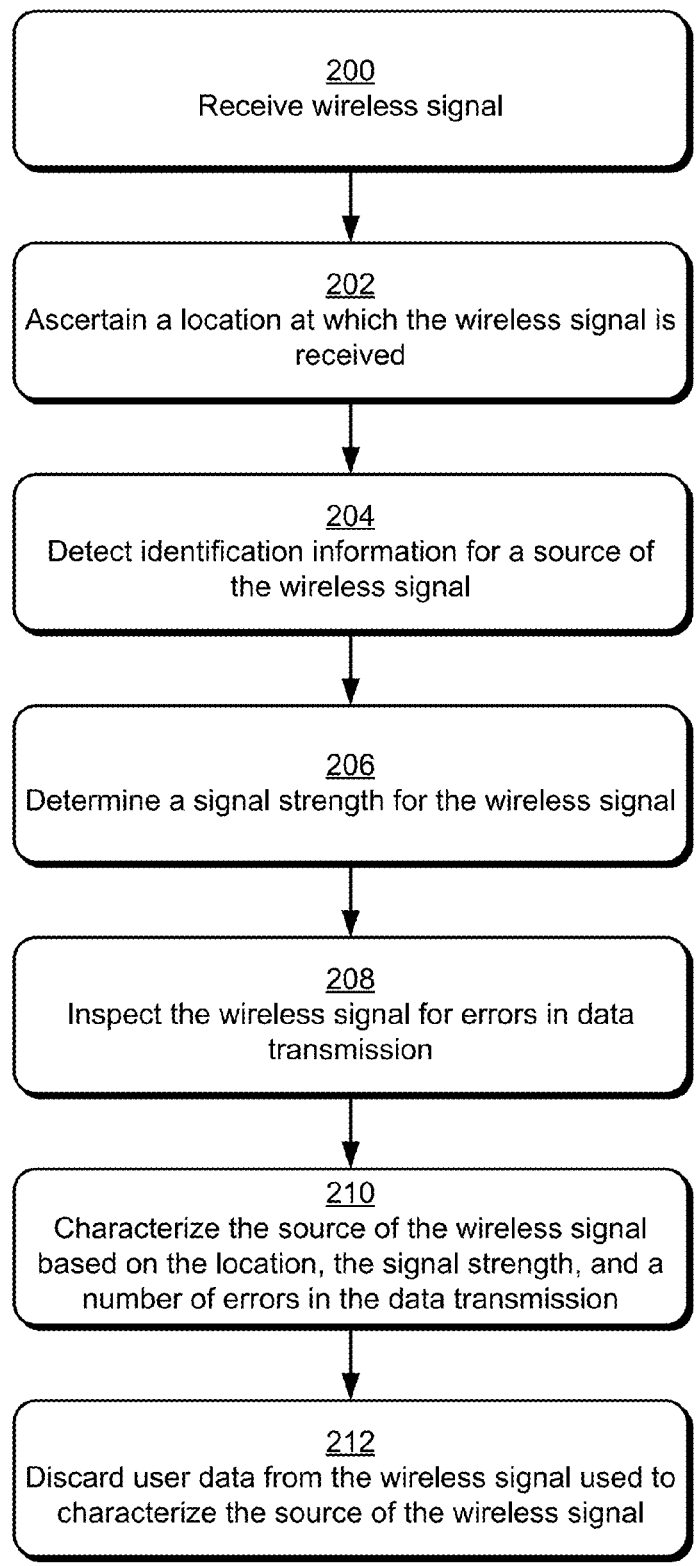
FIG. 2 is a flow diagram that describes steps in a method in accordance with one or more embodiments.

FIG. 2 is a flow diagram that describes steps in a method in accordance with one or more embodiments. Step 200 receives wireless signal. For instance, the detection device 102 can receive wireless signal via the detection hardware 106. The wireless signal can include various types of data transmitted by a particular entity, such as control data and user data transmitted by the wireless access point 108.

Step 202 ascertains a location at which the wireless signal is received. For example, geographic coordinates for a device that receives the wireless signal can be determined. With reference to the environment 100, the location module 110 can ascertain geographic coordinates and/or other location parameters for a location at which the detection device 102 is receiving wireless signals from the wireless access point 108.

Step 204 detects identification information for a source of the wireless signal. For instance, control data included as part of data packets in the wireless signal can be inspected to determine various identifying characteristics of a device and/or entity that transmitted the signal. Examples of identification information include a media access control (MAC) address for a transmitting device, a service set identifier (SSID) for a transmitting device and/or associated wireless network, make and/or model of a transmitting device, and so on. Other types of information may also be determined from control data included with packets, examples of which are discussed below.

Step 206 determines a signal strength for the wireless signal. For instance, the detection device 102 can employ a signal strength meter to measure the strength of the wireless signal. One example way of determining signal strength is using a received signal strength indicator (RSSI) that measures the power of a received wireless signal. Various other techniques, however, may be employed to measure signal strength within the spirit and scope of the claimed embodiments.

Step 208 inspects the wireless signal for errors in data transmission. For instance, various types of processing can be applied to a wireless signal to determine if errors in data transmission exist in the received signal.

One example of such processing is applying a cyclical redundancy check (CRC) to data in the wireless signal. A transmitting device, for example, can encode data in a wireless signal using a CRC technique. A device that receives the signal (e.g., the detection device 102) can attempt to decode the data using a CRC. If the data doesn't pass the CRC (e.g., a calculated CRC check value does not match an expected check value), the data can be determined to include errors that may have been introduced during transmission. If the data passes the CRC, the data can be determined to be relatively error-free.

Another technique that may be employed is error correction coding, such as forward error correction (FEC). For instance, data that is transmitted in a wireless signal can be encoded prior to transmission (e.g., using a block code, a convolution code, and so on) to enable a receiving device to determine whether errors are present in the data when it is received. Further, such encoding can enable a receiving device to quantify how many errors are present, such as a number of flipped bits, a number of omitted bits, and so on. Correction coding may also enable a receiving device to correct such errors.

In at least some implementations, multiple different types of encoding may be employed for data that is to be transmitted wirelessly. For instance, data may be encoded using FEC encoding, and the resulting FEC-encoded data may then be encoded using CRC encoding. The FEC/CRC encoded data may then be transmitted, e.g., by the wireless access point 108. A receiving device (e.g., the detection device 102) can decode the data first using a CRC decoder, and then an FEC decoder. This can enable a receiving device to determine overall data integrity based on attempted CRC decoding, and to quantify and/or repair data errors via FEC decoding.

Step 210 characterizes the source of the wireless signal based on the location, the signal strength, and a number of errors in the data transmission. For instance, if the signal strength is high at the location and data errors are few, the source can be characterized as providing a high quality wireless signal at the location. Conversely, if the signal strength is low and/or data errors are high, the source can be characterized as providing a low quality wireless signal at the location. Further implementations for characterizing a source of wireless signal are detailed below.

Step 212 discards user data from the wireless signal used to characterize the source of the wireless signal. Thus, in at least some embodiments, the user data is never stored or viewed. As referenced above, various types of data from a wireless signal can be used in processing and/or characterizing a source of the wireless signal. Examples of such data include control data, user data, and so forth. In implementations that utilize user data, the user data can be discarded after various characteristics of the wireless signal are measured and/or determined. Further, characteristics of a wireless signal can be determined without decrypting encrypted user data included in the signal.

In at least some implementations, the method described above can be performed to characterize a source of wireless signal at multiple different locations. For instance, consider the follow implementation scenarios.

Figure 3:
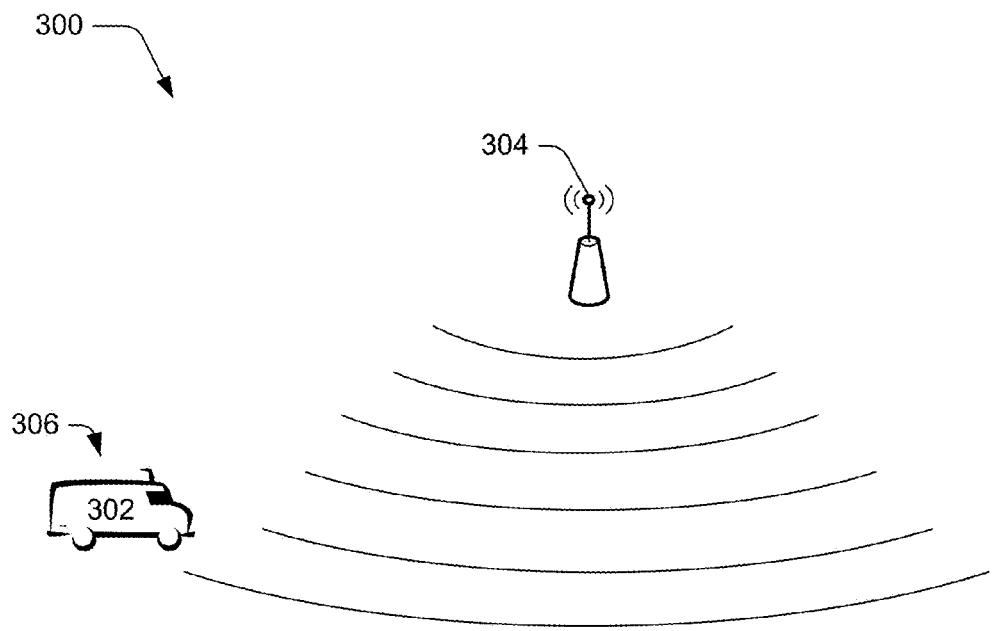
FIG. 3 illustrates an example implementation scenario in accordance with one or more embodiments.

FIG. 3 illustrates an example implementation scenario 300 in accordance with one or more embodiments. The scenario 300 includes a mobile detection device 302, which can be implemented as a mobile form of the detection device 102, discussed above. Further included is a wireless access point 304 that transmits data wirelessly, e.g., as part of a WLAN. In the scenario 300, the mobile detection device 302 is at a position 306 where the mobile detection device 302 does not detect wireless data transmission from the wireless access point 304.

Figure 4:
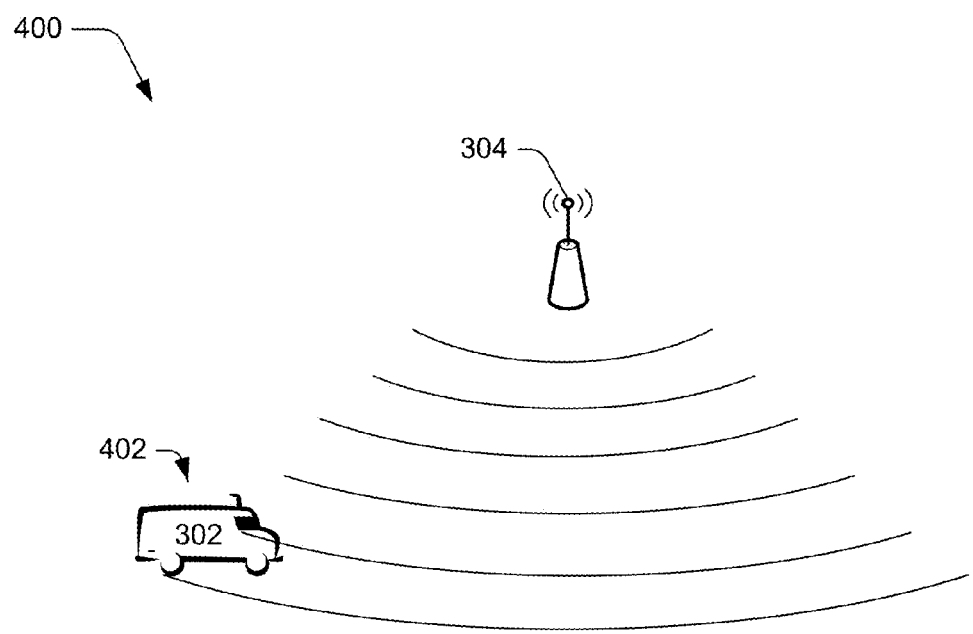
FIG. 4 illustrates an example implementation scenario in accordance with one or more embodiments.

FIG. 4 illustrates an example implementation scenario 400 in accordance with one or more embodiments. In the scenario 400, the mobile detection device 302 has moved from the position 306 to a position 402. For instance, movement of the mobile detection device 302 can occur along a roadway to different geographic positions.

Further to the scenario 400, the mobile detection device 302 detects wireless data transmission from the wireless access point 304 at the position 402. The mobile detection device 302 characterizes the wireless access point 304 at the position 402 based on the detected data transmission, e.g., according to the method described above with reference to FIG. 2 and/or other techniques discussed herein. For instance, the mobile detection device 302 records position information for the position 402, such as geographic coordinates. Further, the mobile detection device 302 determines a quality of the received wireless signal at the position 402, such as with reference to signal strength, data quality based on a number of data errors, and so on. Thus, the mobile detection device 302 can characterize the wireless access point 304 as providing a high quality signal at the position 402, a medium quality signal, a low quality signal, and so on.

In the scenario 400, the mobile detection device 302 characterizes the wireless access point 304 as providing a low quality signal at the position 402. For instance, perhaps the position 402 is near the periphery of a maximum transmission range for the wireless access point 304. Alternatively or additionally, the position 402 may be in a high signal noise region such that a signal-to-noise (S/N) ratio for wireless access point 304 is low.

Figure 5:
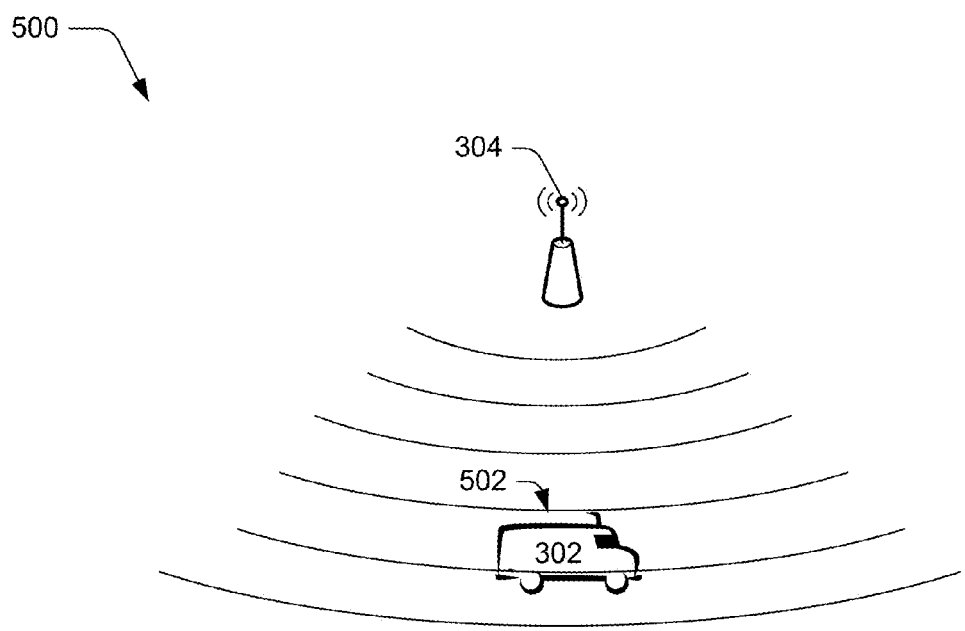
FIG. 5 illustrates an example implementation scenario in accordance with one or more embodiments.

FIG. 5 illustrates an example implementation scenario 500 in accordance with one or more embodiments. In the scenario 500, the mobile detection device 302 has moved from the position 402 to a position 502.

Further to the scenario 500, the mobile detection device 302 detects wireless data transmission from the wireless access point 304 at the position 502. The mobile detection device 302 characterizes the wireless access point 304 at the position 502 based on the detected data transmission.

In the scenario 500, the mobile detection device 302 characterizes the wireless access point 304 as providing high quality signal at the position 502. For instance, the position 502 can be associated with medium-to-high signal strength, and/or few errors in data transmission.

Figure 6:
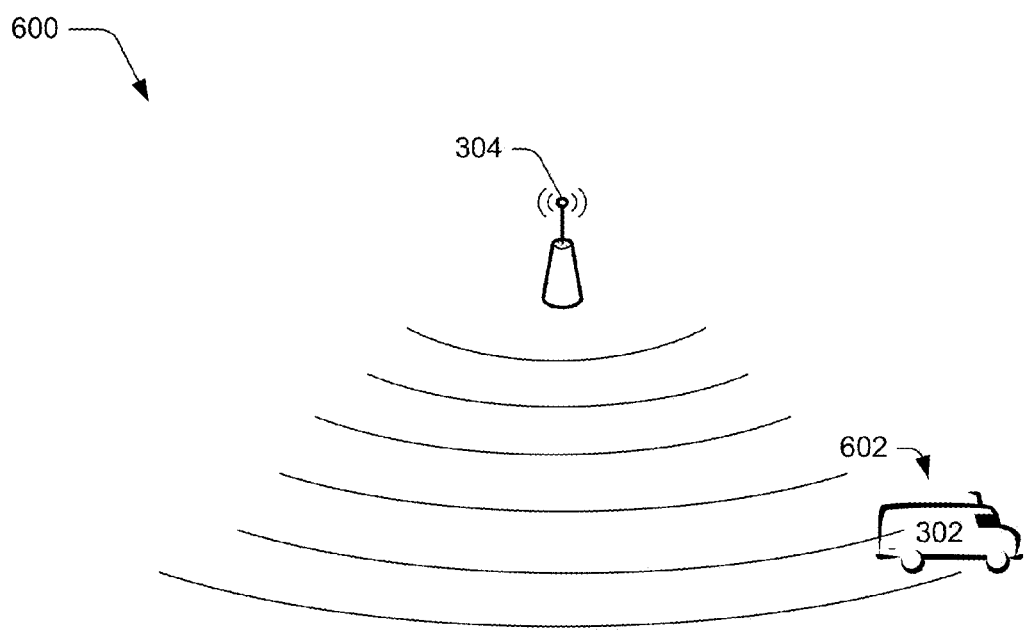
FIG. 6 illustrates an example implementation scenario in accordance with one or more embodiments.

FIG. 6 illustrates an example implementation scenario 600 in accordance with one or more embodiments. In the scenario 600, the mobile detection device 302 has moved from the position 502 to a position 602.

Further to the scenario 600, the mobile detection device 302 detects wireless data transmission from the wireless access point 304 at the position 602. The mobile detection device 302 characterizes the wireless access point 304 at the position 602 based on the detected data transmission.

In the scenario 600, the mobile detection device 302 characterizes the wireless access point 304 as providing low quality signal at the position 602. For instance, the position 602 can be associated with low signal strength, and/or multiple errors in data transmission, e.g., low S/N ratio.

Figure 7:
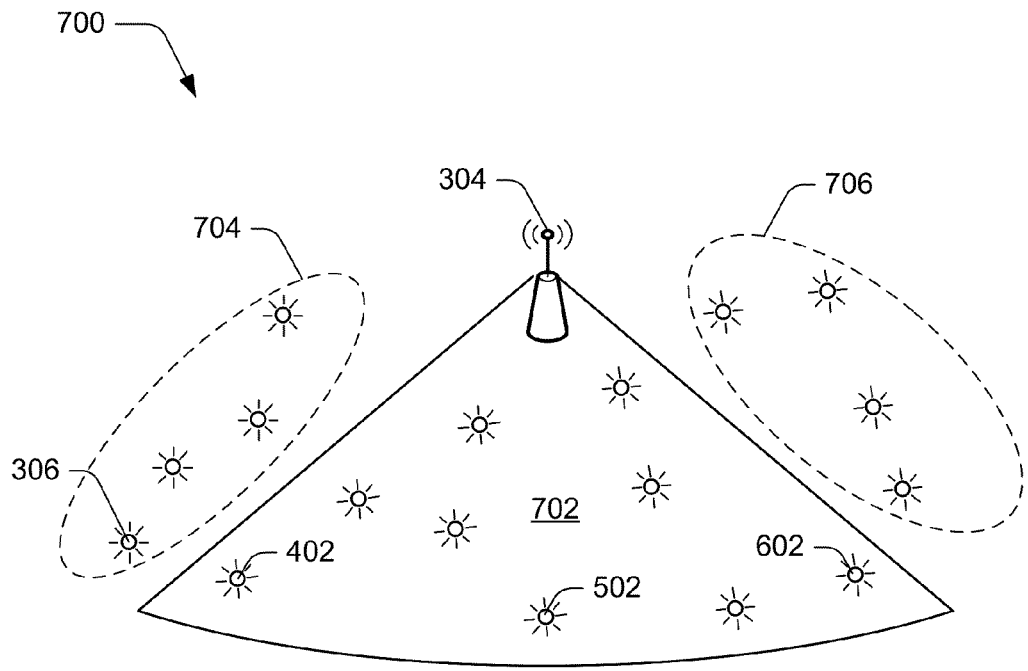
FIG. 7 illustrates an example implementation scenario in accordance with one or more embodiments.

FIG. 7 illustrates an example implementation scenario 700 in accordance with one or more embodiments. In the scenario 700, a signal mapping 702 is generated for the wireless access point 304. For instance, the signal mapping 702 can be generated based on characterizations of the wireless access point 304 at different geographic positions, such as the positions 306, 402, 502, and 602 discussed above.

Illustrated as part of the scenario 700 are a signal position group 704 and a signal position group 706. The signal position groups 704, 706 include indications of geographic positions as which the access point 304 is characterized according to techniques discussed herein. The wireless signal quality for the access point 304 at the signal position groups 704, 706 is determined to be below a threshold signal quality, and thus the corresponding geographic positions are omitted from the signal mapping 702. For instance, signal strength at the signal position groups 704, 706 may be below a threshold signal strength, and/or a detected data error rate may be above a threshold data error rate. For instance, the signal position group 704 includes the position 306, discussed above.

Further illustrated are the positions 402, 502, and 602. As referenced above, wireless signal from the wireless access point is detected and characterized at the positions 402, 502, and 602. In at least some implementations, wireless signal at the positions 402, 502, and 602 can be determined to be at or above a threshold signal quality. Thus, the positions 402, 502, and 602, along with several other illustrated geographical positions, are used to delineate a boundary for the signal mapping 702.

According to various embodiments, the signal mapping 702 can correspond to an effective wireless signal reception range for the wireless access point 304. For instance, the signal mapping 702 can define a boundary of geographical coordinates within which wireless signal from the wireless access point 304 can be received with acceptable signal quality and/or signal strength.

Figure 8:
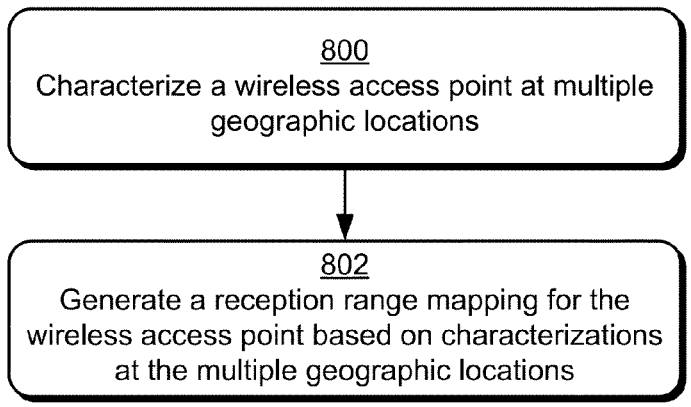
FIG. 8 is a flow diagram that describes steps in a method in accordance with one or more embodiments.

FIG. 8 is a flow diagram that describes steps in a method in accordance with one or more embodiments. Step 800 characterizes a wireless access point at multiple geographic locations. For instance, the wireless access point can be characterized with respect to signal quality and/or other factors at the different locations, such as utilizing techniques discussed herein.

Step 802 generates a reception range mapping for the wireless access point based on characterizations at the multiple geographic locations. For example, geographic locations that meet or exceed a threshold signal quality can be mapped to form a reception range for a transmitting device. Geographic locations that fall below the threshold signal quality can be excluded from the mapping. As discussed elsewhere herein, signal quality can be determined based on various factors, such as signal strength, a number of data errors in the signal, and so forth.

Figure 9:
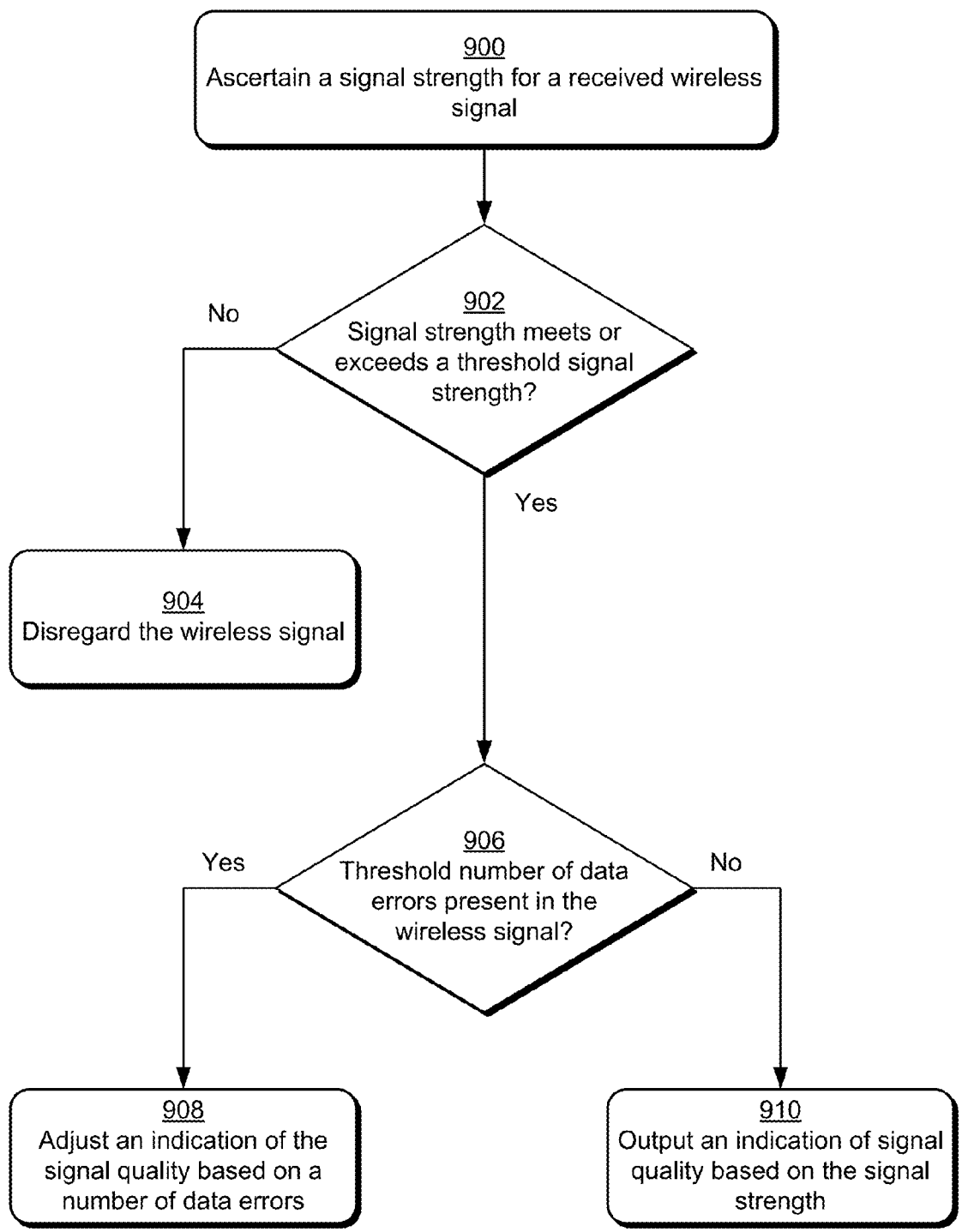
FIG. 9 is a flow diagram that describes steps in a method in accordance with one or more embodiments.

FIG. 9 is a flow diagram that describes steps in a method in accordance with one or more embodiments. In at least some implementations, the method presents an example way of determining a wireless signal quality for a wireless access point. For instance, the method describes an example way of characterizing a wireless access point, such as discussed above with reference to step 210 of FIG. 2 and step 800 discussed above with reference to FIG. 8.

Step 900 ascertains a signal strength for a received wireless signal. The signal strength, for instance, can be measured in terms of RSSI. Various units may additionally or alternatively be used to measure signal strength, such as decibels per milliwatt (dBm), watts (W), and so on.

Step 902 determines whether the signal strength meets or exceeds a threshold signal strength. For instance, the threshold signal strength can be defined in terms of RSSI, such as a number of bars indicated on an RSSI meter. Alternatively or additionally, the threshold signal strength can be defined in terms of other units, such as dBm, decibels (dB), watts, and so on. In at least some implementations, the threshold signal strength can be predefined, and or designated "on-the-fly" while signal strength measurements are being taken.

In an event that the signal strength falls below the threshold signal strength ("No"), step 904 disregards the wireless signal. For instance, the wireless signal can be ignored for purposes of further processing.

In an event that the signal strength meets or exceeds the threshold signal strength ("Yes"), step 906 ascertains whether there a threshold number of data errors are present in the wireless signal. For instance, data in the wireless signal can be decoded with a CRC decoder and/or an FEC decoder to determine if and how many data errors are present, as discussed above. A threshold number of data errors can be defined in various ways, such as in terms of a threshold bit error rate, packet error rate, and so forth.

In an event that a threshold number of data errors are present in the wireless signal ("Yes"), step 908 adjusts an indication of the signal quality based on a number of data errors. For instance, if the number of data errors exceeds a threshold number of errors, the wireless signal can be determined to be a low quality signal. A threshold number of errors can be defined in a variety of ways, such as a threshold bit error rate, a threshold packet error rate, a threshold number of bit corrections that were performed (e.g., via FEC), and so on. In at least some implementations, a low quality signal can be disregarded for purposes of determining an effective range for a wireless access point. Otherwise, and indication of a low quality signal can be used in mapping an effective range for a wireless access point, such as for determining a periphery of the effective range.

In at least some implementations, an indication of signal quality can be based on signal strength for a received wireless signal. For instance, signal quality can be characterized using an RSSI range, such as defined by the 802.11 standards. Accordingly, an indication of signal quality that is based on signal strength can be adjusted based on a number of data errors that are detected in a wireless signal.

For instance, consider a scenario where an error rate (e.g., a bit error rate, a packet error rate, and so forth) is determined for data in a wireless signal. The error rate, for example, can be expressed in terms of a percentage of data that included errors, such as determined via CRC decoding, FEC decoding, and so forth. In such embodiments, an indication of signal quality that is based on signal strength can be reduced based on the error rate.

As an example implementation, consider an RSSI range of zero (no detected signal strength) to 100 (maximum detected signal strength). In this implementation, a detected RSSI value for a wireless signal can be reduced at a percentage that corresponds to a percentage error rate determined for data included in the wireless signal. For instance, a detected RSSI value of 60 can be reduced by 20% based on a detected error rate of 20%, to provide an adjusted signal quality indication of 48, e.g., on a scale of 0-100. Thus, in at least some embodiments, an indication of wireless signal quality that is based on wireless signal strength can be reduced based on a detected data error rate, such as proportionally to the error rate.

In an event that a threshold number of data errors are not present in the wireless signal, step 910 outputs an indication of signal quality based on the signal strength. For example, an RSSI based on the detected signal strength can be output, e.g., as part of a graphical user interface. Alternatively or additionally, the indication of signal quality can be utilized in mapping an effective reception range for a source of the wireless signal. In at least some implementations, the method described above can be performed at multiple different locations to determine signal quality at the different locations, and to map a signal range for a source of the wireless signal based on the signal quality at the different locations.

Distance Mapping for Wireless Access Points

According to at least some embodiments, techniques discussed herein can be employed to determine a distance from a detection device to a wireless access point. For example, a wireless signal that is processed and/or characterized utilizing techniques discussed above may be further processed to determine a distance from a detecting device (e.g., the detection device 102) to a wireless access point (e.g., the wireless access point 108) that transmitted the signal. The distance measurement may be utilized to further refine a mapping of an effective reception range for the wireless access point. For instance, consider the following example method.

Figure 10:
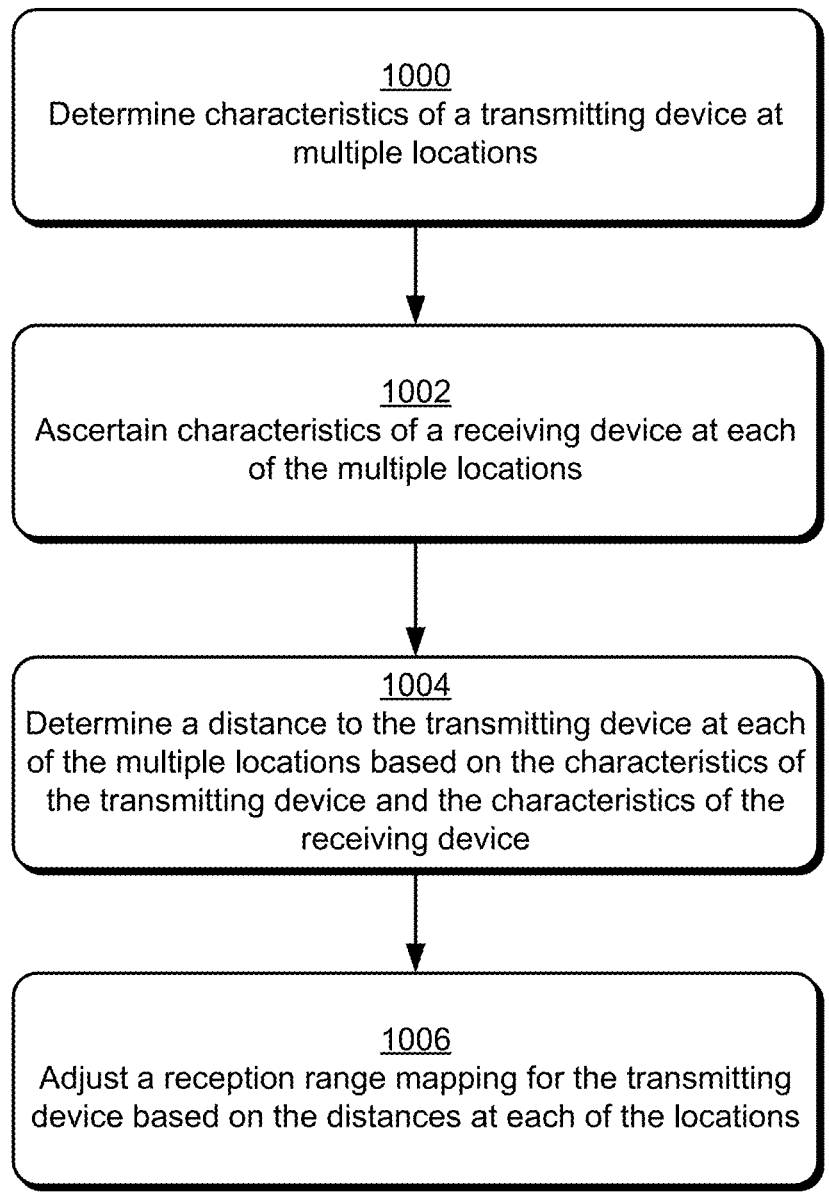
FIG. 10 is a flow diagram that describes steps in a method in accordance with one or more embodiments.

FIG. 10 is a flow diagram that describes steps in a method in accordance with one or more embodiments. Step 1000 determines characteristics of a transmitting device at multiple locations. For instance, a received wireless signal can include identifying information for a wireless access point that transmitted a wireless signal, such as in control data included with the signal. The control data, for example, can include a make (e.g., manufacturer identifier) and model identifier for a transmitting device. The make and model information can be used to retrieve specifications for the transmitting device, such as signal transmission power, antenna gain, frequency bands used to transmit wireless signal, wireless protocols used (e.g., which 802.11 protocol is supported by the transmitting device), error correction types used by the transmitting device, and so forth.

Step 1002 ascertains characteristics of a receiving device at each of the multiple locations. Various characteristics can be determined based on specifications for a receiving device, such as receiving antenna gain, frequency at which the receiving device is receiving wireless signal, and so forth. Various physical aspects of the receiving device may also be determined, such as a temperature of the receiving device, a power with which a wireless signal is being received, and so on.

Step 1004 determines a distance to the transmitting device at each of the multiple locations based on the characteristics of the transmitting device and the characteristics of the receiving device. For instance, various characteristics of the transmitting device and the receiving device can be applied to a formula to determine a distance between the transmitting device and the receiving device. One example of a suitable formula is a radar equation, which can be applied as follows:

$$\text{Propagation Loss} = (Tp)(Gt) + \frac{Gr}{T} - Sp$$

The variables are defined as follows: Tp is the power with which a transmitting device transmitted the wireless signal, such as in milliwatts; Gt is the gain of an antenna used to transmit the wireless signal, such as in decibels (dB); Gr is the gain of a receiving antenna, such as in dB; Tr is the temperature of the receiving device, such as in Kelvins; and Sp is the power with which the wireless signal is received at the receiving device.

Thus, the calculated propagation loss is a function of the distance between the transmitting device and the receiving device. The equation presented above and its variables are provided for purpose of example only, and a wide variety of different equations and/or techniques may be employed to calculate the distance between a receiving device and a transmitting device.

Step 1006 adjusts a reception range mapping for the transmitting device based on the distances at each of the locations. For example, a reception range mapping that was generated via techniques discussed above can be adjusted to indicate physical distances (e.g., using a suitable distance unit) encompassed by the range mapping.

Value Averaging

According to at least some embodiments, techniques discussed herein can be employed to average various values for a wireless access point, such as signal strength values, signal quality values, error rate values, and so forth. Averaging values can enable a more accurate characterization of a wireless access point at different locations to be obtained.

Figure 11:
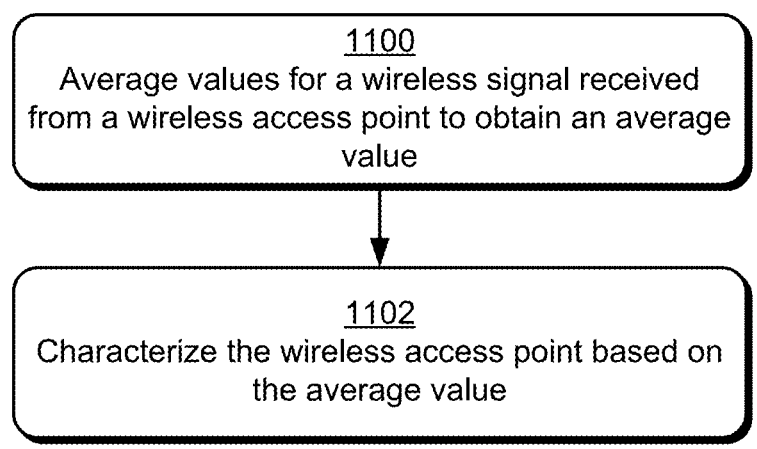
FIG. 11 is a flow diagram that describes steps in a method in accordance with one or more embodiments.

FIG. 11 is a flow diagram that describes steps in a method in accordance with one or more embodiments. Step 1100 averages values for a wireless signal received from a wireless access point to obtain an average value. As referenced above, the values can be signal strength values, signal quality values, error rate values, distance values, and so forth.

For instance, consider an implementation where multiple signal quality values are calculated at a particular location, such as utilizing techniques discussed above. For purpose of illustration, the signal quality values are 63, 71, 79, 68, and 66. The signal quality values, for instance, can be calculated utilizing techniques discussed above. The signal quality values are added to obtain a sum of 347. The sum of 347 is divided by the number of readings (5) to obtain an average signal quality value of 69.4.

Step 1102 characterizes the wireless access point based on the average value. For instance, the wireless access point can be characterized as having a particular average value at each of multiple locations. The average value can be an average signal strength value, an average signal quality value, an average error rate value, an average distance value, and so on. The characterization of the wireless access point can be utilized for various purposes, such as mapping a reception range for the wireless access point according to techniques discussed herein.

Having discussed some example methods and implementation scenarios, consider now a discussion of an example system and device in accordance with one or more embodiments.

Example System and Device

Figure 12:
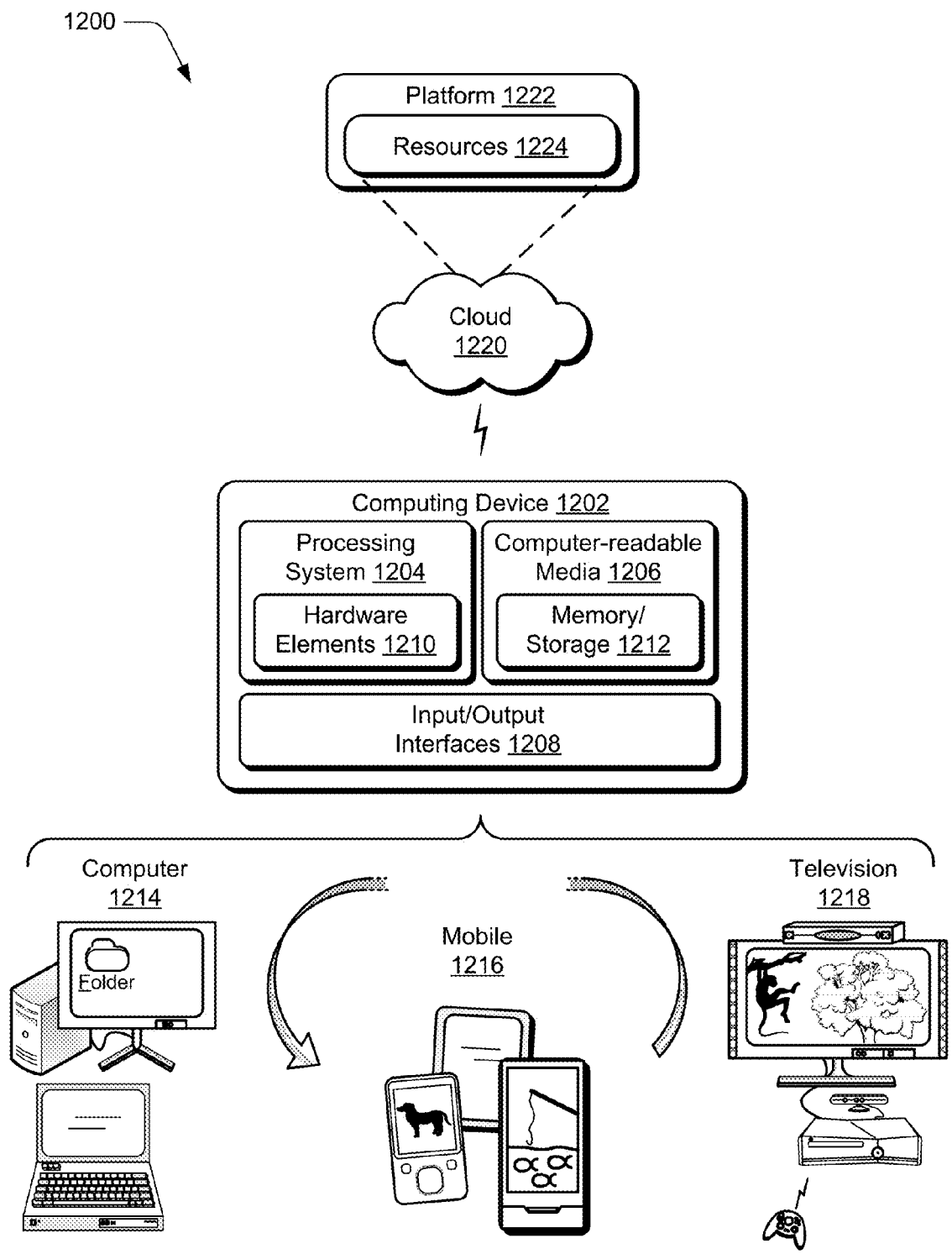
FIG. 12 illustrates an example system and computing device as described with reference to FIG. 1, which are configured to implement embodiments of techniques described herein.

FIG. 12 illustrates an example system generally at 1200 that includes an example computing device 1202 that is representative of one or more computing systems and/or devices that may implement various techniques described herein. For example, the detection device 102 discussed above with reference to FIG. 1 can be embodied as the computing device 1202. The computing device 1202 may be, for example, a server of a service provider, a device associated with the client (e.g., a client device), an on-chip system, and/or any other suitable computing device, apparatus, and/or computing system.

The example computing device 1202 as illustrated includes a processing system 1204, one or more computer-readable media 1206, and one or more I/O Interfaces 1208 that are communicatively coupled, one to another. Although not shown, the computing device 1202 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1204 is representative of functionality to perform one or more operations using hardware. Accordingly, the processing system 1204 is illustrated as including hardware element 1210 that may be configured as processors, functional blocks, and so forth. This may include implementation in hardware as an application specific integrated circuit or other logic device formed using one or more semiconductors. The hardware elements 1210 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable media 1206 is illustrated as including memory/storage 1212. The memory/storage 1212 represents memory/storage capacity associated with one or more computer-readable media. The memory/storage 1212 may include volatile media (such as random access memory (RAM)) and/or nonvolatile media (such as read only memory (ROM), Flash memory, optical disks, magnetic disks, and so forth). The memory/storage 1212 may include fixed media (e.g., RAM, ROM, a fixed hard drive, and so on) as well as removable media (e.g., Flash memory, a removable hard drive, an optical disc, and so forth). The computer-readable media 1206 may be configured in a variety of other ways as further described below.

Input/output interface(s) 1208 are representative of functionality to allow a user to enter commands and information to computing device 1202, and also allow information to be presented to the user and/or other components or devices using various input/output devices. Examples of input devices include a keyboard, a cursor control device (e.g., a mouse), a microphone (e.g., for implementing voice and/or spoken input), a scanner, touch functionality (e.g., capacitive or other sensors that are configured to detect physical touch), a camera (e.g., which may employ visible or non-visible wavelengths such as infrared frequencies to detect movement that does not involve touch as gestures), and so forth. Examples of output devices include a display device (e.g., a monitor or projector), speakers, a printer, a network card, tactile-response device, and so forth. Thus, the computing device 1202 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1202. By way of example, and not limitation, computer-readable media may include "computer-readable storage media" and "computer-readable signal media."

"Computer-readable storage media" may refer to media and/or devices that enable persistent storage of information in contrast to mere signal transmission, carrier waves, or signals per se. Thus, computer-readable storage media does not include signals per se. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1202, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1210 and computer-readable media 1206 are representative of instructions, modules, programmable device logic and/or fixed device logic implemented in a hardware form that may be employed in some embodiments to implement at least some aspects of the techniques described herein. Hardware elements may include components of an integrated circuit or on-chip system, an application-specific integrated circuit (ASIC), a field-programmable gate array (FPGA), a complex programmable logic device (CPLD), and other implementations in silicon or other hardware devices. In this context, a hardware element may operate as a processing device that performs program tasks defined by instructions, modules, and/or logic embodied by the hardware element as well as a hardware device utilized to store instructions for execution, e.g., the computer-readable storage media described previously.

Combinations of the foregoing may also be employed to implement various techniques and modules described herein. Accordingly, software, hardware, or program modules and other program modules may be implemented as one or more instructions and/or logic embodied on some form of computer-readable storage media and/or by one or more hardware elements 1210. The computing device 1202 may be configured to implement particular instructions and/or functions corresponding to the software and/or hardware modules. Accordingly, implementation of modules as an module that is executable by the computing device 1202 as software may be achieved at least partially in hardware, e.g., through use of computer-readable storage media and/or hardware elements 1210 of the processing system. The instructions and/or functions may be executable/operable by one or more articles of manufacture (for example, one or more computing devices 1202 and/or processing systems 1204) to implement techniques, modules, and examples described herein.

As further illustrated in FIG. 12, the example system 1200 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 1200, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link.

In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 1202 may assume a variety of different configurations, such as for computer 1214, mobile 1216, and television 1218 uses. Each of these configurations includes devices that may have generally different constructs and capabilities, and thus the computing device 1202 may be configured according to one or more of the different device classes. For instance, the computing device 1202 may be implemented as the computer 1214 class of a device that includes a personal computer, desktop computer, a multi-screen computer, laptop computer, netbook, and so on.

The computing device 1202 may also be implemented as the mobile 1216 class of device that includes mobile devices, such as a mobile phone, portable music player, portable gaming device, a tablet computer, a multi-screen computer, and so on. The computing device 1202 may also be implemented as the television 1218 class of device that includes devices having or connected to generally larger screens in casual viewing environments. These devices include televisions, set-top boxes, gaming consoles, and so on.

The techniques described herein may be supported by these various configurations of the computing device 1202 and are not limited to the specific examples of the techniques described herein. For example, functionalities discussed with reference to the detection module 104 and/or the location module 110 may be implemented all or in part through use of a distributed system, such as over a "cloud" 1220 via a platform 1222 as described below.

The cloud 1220 includes and/or is representative of a platform 1222 for resources 1224. The platform 1222 abstracts underlying functionality of hardware (e.g., servers) and software resources of the cloud 1220. The resources 1224 may include applications and/or data that can be utilized while computer processing is executed on servers that are remote from the computing device 1202. Resources 1224 can also include services provided over the Internet and/or through a subscriber network, such as a cellular or Wi-Fi™ network.

The platform 1222 may abstract resources and functions to connect the computing device 1202 with other computing devices. The platform 1222 may also serve to abstract scaling of resources to provide a corresponding level of scale to encountered demand for the resources 1224 that are implemented via the platform 1222. Accordingly, in an interconnected device embodiment, implementation of functionality described herein may be distributed throughout the system 1200. For example, the functionality may be implemented in part on the computing device 1202 as well as via the platform 1222 that abstracts the functionality of the cloud 1220.

Discussed herein are a number of methods that may be implemented to perform techniques discussed herein. Aspects of the methods may be implemented in hardware, firmware, or software, or a combination thereof. The methods are shown as a set of blocks that specify operations performed by one or more devices and are not necessarily limited to the orders shown for performing the operations by the respective blocks. Further, an operation shown with respect to a particular method may be combined and/or interchanged with an operation of a different method in accordance with one or more implementations. Aspects of the methods can be implemented via interaction between various entities discussed above with reference to the environment 100.

CONCLUSION

Techniques for wireless access point mapping are described. Although embodiments are described in language specific to structural features and/or methodological acts, it is to be understood that the embodiments defined in the appended claims are not necessarily limited to the specific features or acts described. Rather, the specific features and acts are disclosed as example forms of implementing the claimed embodiments.

What is claimed is:

1. A computer-implemented method, comprising:
   ascertaining a location at which a wireless signal is received;
   determining a signal strength for the wireless signal;
   inspecting the wireless signal for errors in data transmission;
   detecting identification information for an instance of a wireless access point device that is a source of the wireless signal; and
   characterizing, by a computing device, the wireless access point device based on the location, the identification information, the signal strength, and a number of errors in the data transmission.

2. A computer-implemented method as described in claim 1, wherein the location corresponds to a geographic position of a mobile device that receives the wireless signal from the wireless access point device.

3. A computer-implemented method as described in claim 1, wherein said inspecting utilizes at least one of a cyclical redundancy check (CRC) or forward error correction (FEC) decoding to determine a number of errors in the data transmission.

4. A computer-implemented method as described in claim 1, wherein said characterizing comprises determining a quality of the wireless signal based on the signal strength and the number of errors in the data transmission.

5. A computer-implemented method as described in claim 1, further comprising performing said characterizing at multiple different locations, and generating a reception range mapping for the wireless access point device based on characterizations of the wireless access point device at the multiple different locations.

6. A computer-implemented method as described in claim 5, further comprising determining distances from a mobile device that receives the wireless signal to the wireless access point device at the multiple different locations, and adjusting the reception range mapping based on the distances.

7. A computer-implemented method as described in claim 1, wherein said characterizing comprises averaging multiple signal strength values to obtain an average signal strength value for the wireless signal at the location.

8. A computer-implemented method as described in claim 1, wherein said characterizing comprises averaging multiple error rate values based on the number of errors in the data transmission to obtain an average error rate for the wireless signal at the location.

9. A computer-implemented method as described in claim 1, wherein said determining and said inspecting are performed with user data from the wireless signal, and wherein the method further comprises discarding the user data.

10. A computer-implemented method as described in claim 1, further comprising:
    performing said characterizing at multiple different geographic locations; and
    generating a reception range mapping for the wireless access point device based on characterizations of the wireless access point device at the multiple different locations, wherein said generating includes excluding at least some of the multiple geographic locations that fall below a threshold signal quality.

11. One or more computer-readable storage media comprising instructions stored thereon that, responsive to execution by a computing device, cause the computing device to perform operations comprising:
    ascertaining whether a threshold number of data errors are present in a wireless signal; and
    in an event that a threshold number of data errors are present in the wireless signal, adjusting an indication of a quality of the wireless signal based on a number of the data errors; or
    in an event that a threshold number of data errors are not present in the wireless signal, outputting an indication of a quality of the wireless signal based on a strength of the wireless signal.

12. One or more computer-readable storage media as recited in claim 11, wherein the instructions, responsive to execution by the computing device, cause the computing device to ascertain whether the threshold number of data errors are present in the wireless signal by performing one or more of a cyclical redundancy check (CRC) or forward error correction (FEC) decoding on data included in the wireless signal.

13. One or more computer-readable storage media as recited in claim 11, wherein the number of data errors corresponds to a detected error rate, and wherein the instructions, responsive to execution by the computing device, cause the computing device to adjust the indication of the quality of the wireless signal by reducing an indication of a signal strength for the wireless signal based on the detected error rate.

14. One or more computer-readable storage media as recited in claim 13, wherein said reducing comprises reducing the indication of the signal strength at a percentage value that corresponds to the detected error rate.

15. One or more computer-readable storage media as recited in claim 11, wherein the instructions, responsive to execution by the computing device, cause the computing device to output the indication of the quality of the wireless signal by outputting a received signal strength indicator (RSSI) based on the strength of the wireless signal.

16. An apparatus comprising:
    one or more processors; and
    one or more computer-readable storage media storing instructions that are executable by the one or more processors to perform operations including:

characterizing an instance of a wireless access point device at multiple geographic locations based on quality of a wireless signal transmitted from the wireless access point device, the quality being determined based at least on a signal strength for the wireless signal and a number of data errors detected in the wireless signal; and generating a reception range mapping for the wireless access point device based on characterizations of wireless signal at the multiple geographic locations.

17. An apparatus as described in claim 16, wherein the number of data errors detected in the wireless signal are determined by performing one or more of a cyclical redundancy check (CRC) or forward error correction (FEC) decoding on user data included in the wireless signal, and wherein the operations further include discarding the user data after said performing.

18. An apparatus as described in claim 16, wherein the operations further include characterizing the wireless access point device at the multiple geographic locations by determining a distance from the apparatus to the wireless access point device at one or more of the multiple geographic locations.

19. An apparatus as described in claim 16, wherein the operations further include characterizing the wireless access point device at the multiple geographic locations by averaging signal strength values and data error rates for the wireless signal at one or more of the multiple geographic locations to obtain an average signal strength and an average data error rate at the one or more of the multiple geographic locations.

20. An apparatus as described in claim 16, wherein the operations further include generating the reception range mapping by excluding one or more of the multiple geographic locations that fall below a threshold signal quality.

\* \* \* \* \*